United States Patent [19]
Nakagawa et al.

[11] Patent Number: 5,858,120
[45] Date of Patent: Jan. 12, 1999

[54] PHOTOVOLTAIC DEVICE

[75] Inventors: Katsumi Nakagawa; Yukiko Iwasaki, both of Nara, Japan

[73] Assignee: Canon Kabushiki Kaisha, Tokyo, Japan

[21] Appl. No.: 745,936

[22] Filed: Nov. 8, 1996

[30] Foreign Application Priority Data

Nov. 10, 1995 [JP] Japan .................................. 7-315832

[51] Int. Cl.$^6$ .................................................. H01L 31/00
[52] U.S. Cl. ............................................................ 136/256
[58] Field of Search ............................................... 136/256

[56] References Cited

U.S. PATENT DOCUMENTS 4,492,181  1/1985  Ovshinsky et al. ..................... 118/718
5,668,050  9/1997  Iwasaki ..................................... 136/256

FOREIGN PATENT DOCUMENTS 3030419  2/1991  Japan .

*Primary Examiner*—Mark Chapman
*Attorney, Agent, or Firm*—Fitzpatrick, Cella, Harper & Scinto

[57] ABSTRACT

A photovoltaic device comprises a photovoltaic layer, a transparent electrode layer provided on the photovoltaic layer in close contact, and a transparent protective layer further provided in contact therewith, wherein the transparent electrode layer comprises $Zn_2In_2O_5$. This photovoltaic device can prevent reflection of light and improves conversion efficiency.

66 Claims, 8 Drawing Sheets

PHOTOVOLTAIC DEVICE

BACKGROUND OF THE INVENTION

1. Field of the Invention

This invention relates to a photovoltaic device, and more particularly to a photovoltaic device that can be mass-produced with ease and has a superior conversion efficiency.

2. Related Background Art

In recent years, as future energy sources for human beings, it is discussed whether we may entirely rely on oil and coal, which are said to make the environment of the earth warm because of carbon dioxide generated as a result of their use, and on atomic energy, which can not be said to be perfectly free from the risk of the radiation leakage that may be caused by any accidents and also may occur even at the time of normal plant operation. Photovoltaic devices are expected to come into much wider use, because their energy source is the sun and they have a very little influence on the environment of the earth. Under existing circumstances, however, there are some problems that obstruct their real spread. In particular, it is a great problem that they require a high production cost for their conversion efficiency (photoelectric conversion efficiency, i.e., the proportion of the energy that can be converted into electric power to the solar radiation energy incident on the surface of a photovoltaic device).

For example, small-area photovoltaic devices making use of single-crystal semiconductors such as Si and GaAs have achieved a conversion efficiency of 24 to 25%, but require much energy and time for producing single-crystal substrates. They also have structures elaborately designed so that the conversion efficiency can be improved, but the process for their fabrication becomes complicated to bring about an extreme increase in production cost. In the case of polycrystalline silicon that enables relatively easy fabrication, the production cost can be reasonably low, but the conversion efficiency is about 17 to 18% as for those having a small area, and about 14 to 15% as for those having a large area. In the case of amorphous silicon (hereinafter "a-Si") that enables much easier fabrication and can achieve a lower production cost, the conversion efficiency is about 12% even as for those having a small area, and about 10% as for those having a large area. Thus, it has been considered difficult for photovoltaic devices to achieve both the improvement in conversion efficiency and the cost reduction at the same time.

In order to improve conversion efficiency, it is advantageous to utilize as effectively as possible the solar radiation to be made incident. The first factor that determines the utilization rate of solar radiation in photovoltaic devices is light absorption characteristics of the semiconductors to be used. In general, when semiconductors capable of even absorbing light having longer wavelengths, the output voltage tends to lower, and the conversion efficiency is not necessarily improved as expected in some cases.

The second factor that determines the utilization rate of solar radiation in photovoltaic devices is to decrease reflection loss of the light made incident on the surface of a semiconductor. In general, semiconductor layers have a great refractive index, which is about 3.4 for Si, about 3.6 for GaAs and about 3.5 for InP in the visible light region, and the reflection of light on the surface thereof reaches about 30%, which is large enough not to be negligible. To solve this problem, it is attempted to provide a reflection preventive layer on the surface of the semiconductor.

In the simplest instance in which one reflection preventive layer is provided, no reflection is known to occur so long as the following relationship is established when, with respect to light having a wavelength $\lambda$, refractive index of the exterior is represented by no, refractive index of the semiconductor layer by ns, refractive index of the reflection preventive layer by na, and thickness of the reflection preventive layer by da, as shown in FIG. 1.

$$na=(no \cdot ns)^{1/2} \quad (1)$$

$$da=\lambda/4na \quad (2)$$

In the case when the exterior is air, no=1, and hence, when, e.g., the semiconductor layer is formed of Si, ns=3.4. Therefore, a value of na=1.84 is optimum. In the case of ITO (mainly composed of $In_2O_3$ and containing a small amount of $SnO_2$) or ZnO, n=1.8 to 2.0 in approximation, thus this substantially fulfills the condition (1).

Further in accordance with the condition (2), assume that these materials are formed in a thickness of 68 to 72 nm, they come to reflect substantially no light of $\lambda$=550 nm, so that the reflection can be reasonably lowered even in the whole visible light region.

In addition, when ITO or ZnO is deposited under appropriate conditions and optionally doped, conductivity $\sigma$ can be enhanced up to about $10^{-4}$ $\Omega \cdot cm$, thus it can function as an electrode. Hence, ITO and ZnO are suitable as transparent electrodes, and are widely used in photovoltaic devices. From the viewpoint of production, these materials can also be deposited by early established processes such as vacuum deposition and sputtering, and the cost therefor can also be low when formed in a thickness of about 70 nm.

The photovoltaic devices used as solar cells, however, are exposed to the weather and used over a long period of time in that state. Hence, their surfaces must be protected. What are usually widely used therefor are glass plates and resin films. In the case of crystal photovoltaic devices, they are usually used in the state that glass sheets or wafers are stuck to the surfaces using a transparent adhesive such as PVA (polyvinyl acetate). In the case of a-Si photovoltaic devices, a-Si is deposited on glass substrates and is so designed that light is incident on the substrate side, whereby their weatherability can be ensured. In the case of photovoltaic devices prepared by deposition on flexible substrates such as stainless steel sheets, their surfaces can be protected with fluorine type resin films having a weatherability, to thereby making the most of flexibiltiy. Such films, glass sheets and so forth stuck to the surfaces of solar cells later are hereinafter called protective layers without regard to materials therefor.

Incidentally, the use of protective layers causes an additional problem. Materials for the protective layers usually have a refractive index of about 1.3 to about 1.6 in the visible light region. In the case of Si, its refractive index is ns=3.4. Assume that the refractive index of a protective layer is no=1.5, referring back to the expression (1), its preferable refractive index na is 2.25. Such a refractive index is unsuitable for ITO or ZnO, and hence there occurs a reflection loss of 5% or more. Meanwhile, ZnS (na=2.3) and $TiO_x$ (na=2.2 to 2.7 depending on production processes) are known as transparent materials having a high refractive index, and these can theoretically solve these problems. These materials, however, have so much a higher resistance than ITO and ZnO that these can not well serve as electrodes. When used inevitably, comb-shaped grid electrodes having a high density must be used in combination, so that the shade thereof virtually makes the utilization rate of incident light lower and the incident light is still not well utilized. From the viewpoint of manufacture, when sputtering is carried out, the resistance of targets must be made higher, and hence a high deposition rate can be achieved with difficulty, bring about a disadvantage.

As methods for improving the utilization rate of incident light, it is well known to form the reflection preventive layer in double layers. In this case, there are various manners of designing. To apply such a method to semiconductors, when refractive index of the transparent electrode on the exterior side (the protective layer side) is represented by na1, its thickness by da1, refractive index of a transparent electrode on the semiconductor layer side by na2, and its thickness by da2, as shown in FIG. 2, the following conditions may be fulfilled.

$$no \cdot ns = na1 \cdot na2 \tag{3}$$

$$\cos^2\delta = (na2^2 \cdot no - na1^2 \cdot ns)/(na1 + na2) \cdot (no \cdot na2 - na1 \cdot ns) \tag{4}$$

where $$\delta = \pi \cdot na1 \cdot da1/\lambda = \pi \cdot na2 \cdot da2/\lambda \tag{4'}$$

So long as the foregoing is fulfilled, the reflectance becomes zero at two wavelengths and can be decreased over a wide range, so that the utilization rate of incident light can be made much higher. However, if it is attempted to apply this planning to an instance where light is incident on the protective layer side or transparent electrode side, it follows that, when, for example, the refractive index of Si, ns is 3.4 and the protective layer refractive index no is 1.5 like the previous instance, the expression (3) gives na1·na2=5.1. Assume that ITO is used in the transparent electrode on the exterior side, a value of na2=2.55 is optimum from the expression (3) (wherein na1=2.0), so that this planning can not be carried out because no suitable material can be found among materials (having a low resistance) usable as the transparent electrode on the semiconductor layer side. Thus, because of restrictions in respect of physical properties of the materials for transparent electrodes, the light incident on photovoltaic devices is not well utilized. Hence, in respect of conversion efficiency, too, there is still room for improvement.

SUMMARY OF THE INVENTION

The present invention was made taking account of such existing circumstances. Accordingly, an object of the present invention is to solve the problems as discussed above, by making the most of physical properties of a transparent electrode material newly found, to thereby provide a photovoltaic device that has a high conversion efficiency because the incident sunlight can be well effectively utilized.

Another object of the present invention is to provide a photovoltaic device that is almost free from factors of any cost increase accompanying its actual fabrication and can contribute to the real spread of solar electric power generation.

To achieve the above objects, the present invention provides a photovoltaic device comprising a back-surface electrode layer, a photovoltaic layer, a transparent electrode layer provided on the photovoltaic layer in close contact, and a transparent protective layer further provided thereon; wherein the transparent electrode layer comprises $Zn_\alpha In_\beta O_\gamma$ ($0<\alpha,\beta,\gamma$) and has a thickness which is ¼n of the wavelength of light to which the photovoltaic device has a maximum sensitivity, where n is a refractive index of the transparent electrode layer at that wavelength.

The present invention also provides a photovoltaic device comprising a back-surface electrode layer, a photovoltaic layer, at least two transparent electrode layers provided on the photovoltaic layer in close contact, and a transparent protective layer further provided thereon; wherein the transparent electrode layer on the photovoltaic layer side comprises $Zn_\alpha In_\beta O_\gamma$ ($0<\alpha,\beta,\gamma$) and the transparent electrode layer on the transparent protective layer side has a refractive index made lower than the transparent electrode layer on the photovoltaic layer side, with respect to at least light having a wavelength at which the photovoltaic device has a maximum sensitivity.

The present invention still also provides a photovoltaic device comprising a back-surface electrode layer, a photovoltaic layer, a transparent electrode layer provided on the photovoltaic layer in close contact, and a transparent protective layer further provided thereon; wherein the transparent electrode layer comprises $Zn_\alpha In_\beta O_\gamma$ ($0<\alpha,\beta,\gamma$), and a value of $\alpha/(\alpha+\beta)$ becomes monotonously greater in that layer from the protective layer side toward the photovoltaic layer side but a maximum value thereof does not exceed 0.5.

The present invention further provides a photovoltaic device comprising a back-surface electrode layer, a photovoltaic layer, a transparent electrode layer provided on the photovoltaic layer in close contact, and a transparent protective layer further provided thereon; wherein the transparent electrode layer comprises $Zn_\alpha In_\beta O_\gamma$ ($0<\alpha,\beta,\gamma$), and a value of $\beta/(\alpha+\beta)$ becomes monotonously greater in that layer from the protective layer side toward the photovoltaic layer side but a maximum value thereof does not exceed 0.5.

The present invention still further provides a photovoltaic device comprising a transparent substrate, a transparent electrode layer provided thereon in close contact, a photovoltaic layer further provided thereon in close contact, and a back-surface electrode layer; wherein the transparent electrode layer comprises $Zn_\alpha In_\beta O_\gamma$ ($0<\alpha,\beta,\gamma$) and has a thickness which is ¼n of the wavelength of light to which the photovoltaic device has a maximum sensitivity, where n is a refractive index of the transparent electrode layer at that wavelength.

The present invention still further provides a photovoltaic device comprising a transparent substrate, at least two transparent electrode layers provided thereon in close contact, a photovoltaic layer further provided thereon in close contact, and a back-surface electrode layer; wherein the transparent electrode layer on the photovoltaic layer side comprises $Zn_\alpha In_\beta O_\gamma$ ($0<\alpha,\beta,\gamma$) and the transparent electrode layer on the transparent substrate side has a refractive index made lower than the transparent electrode layer on the photovoltaic layer side, with respect to at least light having a wavelength at which the photovoltaic device has a maximum sensitivity.

The present invention still further provides a photovoltaic device comprising a transparent substrate, a transparent electrode layer provided thereon in close contact, a photovoltaic layer further provided thereon in close contact, and a back-surface electrode layer; wherein the transparent electrode layer comprises $Zn_\alpha In_\beta O_\gamma$ ($0<\alpha,\beta,\gamma$), and a value of $\alpha/(\alpha+\beta)$ becomes monotonously greater in that layer from the transparent substrate side toward the photovoltaic layer side but a maximum value thereof does not exceed 0.5.

The present invention still further provides a photovoltaic device comprising a transparent substrate, a transparent electrode layer provided thereon in close contact, a photovoltaic layer further provided thereon in close contact, and a back-surface electrode layer; wherein the transparent electrode layer comprises $Zn_\alpha In_\beta O_\gamma$ ($0<\alpha,\beta,\gamma$), and a value of $\beta/(\alpha+\beta)$ becomes monotonously greater in that layer from the transparent substrate side toward the photovoltaic layer side but a maximum value thereof does not exceed 0.5.

In addition, the present invention also provides a photovoltaic device comprising a photovoltaic layer and a protective layer provided thereon, interposing a transparent conductive layer between them; wherein the transparent conductive layer comprises $Zn_\alpha In_\beta O_\gamma$ ($0<\alpha,\beta,\gamma$).

BRIEF DESCRIPTION OF THE DRAWINGS

FIGS. 9, 10, 11A and 11B each illustrate an example of a sputtering apparatus, in which FIGS. 9, 10 and 11B are diagrammatic cross sections thereof, and FIG. 11A, a cross section to diagrammatically show the dispositional relationship.

DESCRIPTION OF THE PREFERRED EMBODIMENTS

Figure 1:
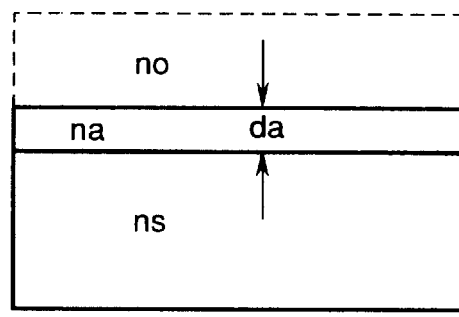
FIGS. 1, 2 and 12 are each a diagrammatic cross section to illustrate an example of the positional relationship between a photovoltaic layer and a transparent conductive layer.

As previously stated, for photovoltaic devices having practical constitution (i.e., photovoltaic devices wherein light is incident through protective layers or transparent substrates), it is necessary to use a transparent material (transparent conductive material) having a high refractive index and also a high conductivity, in order to improve factors on the light-incident side to enhance the utilization rate of incident light. As such a material, $Zn_\alpha In_\beta O_\gamma$ ($0<\alpha,\beta,\gamma$) has been discovered (Jpn. J. Appl. Phys., Vol. 34, 1995, pp.L971–974).

The above subject can be settled by a photovoltaic device having at least a back-surface electrode layer, a photovoltaic layer, a transparent electrode layer provided on the photovoltaic layer in close contact, and a transparent protective layer further provided thereon; wherein the transparent electrode layer comprises $Zn_\alpha In_\beta O_\gamma$ ($0<\alpha,\beta,\gamma$) and has a thickness which is ¼n of the wavelength of light to which the photovoltaic device has a maximum sensitivity, where n is a refractive index of the transparent electrode layer at that wavelength.

The photovoltaic device of the present invention may also be a photovoltaic device having at least a back-surface electrode layer, a photovoltaic layer, at least two transparent electrode layers provided on the photovoltaic layer in close contact, and a transparent protective layer further provided thereon; wherein the transparent electrode layer on the photovoltaic layer side comprises $Zn_\alpha In_\beta O_\gamma$ ($0<\alpha,\beta,\gamma$) and the transparent electrode layer on the transparent protective layer side has a refractive index made lower than the transparent electrode layer on the photovoltaic layer side, with respect to at least light having a wavelength at which the photovoltaic device has a maximum sensitivity.

The photovoltaic device of the present invention may still also be a photovoltaic device having at least a back-surface electrode layer, a photovoltaic layer, a transparent electrode layer provided on the photovoltaic layer in close contact, and a transparent protective layer further provided thereon; wherein the transparent electrode layer comprises $Zn_\alpha In_\beta O_\gamma$ ($0<\alpha,\beta,\gamma$), and a value of $\alpha/(\alpha+\beta)$ becomes monotonously greater in that layer from the protective layer side toward the photovoltaic layer side but a maximum value thereof does not exceed 0.5.

The photovoltaic device of the present invention may further be a photovoltaic device having at least a back-surface electrode layer, a photovoltaic layer, a transparent electrode layer provided on the photovoltaic layer in close contact, and a transparent protective layer further provided thereon; wherein the transparent electrode layer comprises $Zn_\alpha In_\beta O_\gamma$ ($0<\alpha,\beta,\gamma$), and a value of $\beta/(\alpha+\beta)$ becomes monotonously greater in that layer from the protective layer side toward the the transparent electrode layer on the transparent protective layer side photovoltaic layer side but a maximum value thereof does not exceed 0.5.

As a photovoltaic device having a different layer configuration, the photovoltaic device of the present invention may still further be a photovoltaic device having at least a transparent substrate, a transparent electrode layer provided thereon in close contact, a photovoltaic layer further provided thereon in close contact, and a back-surface electrode layer; wherein the transparent electrode layer comprises $Zn_\alpha In_\beta O_\gamma$ ($0<\alpha,\beta,\gamma$) and has a thickness which is ¼n of the wavelength of light to which the photovoltaic device has a maximum sensitivity, where n is a refractive index of the transparent electrode layer at that wavelength.

The photovoltaic device of the present invention still further be a photovoltaic device having at least a transparent substrate, at least two transparent electrode layers provided thereon in close contact, a photovoltaic layer further provided thereon in close contact, and a back-surface electrode layer; wherein the transparent electrode layer on the photovoltaic layer side comprises $Zn_\alpha In_\beta O_\gamma$ ($0<\alpha,\beta,\gamma$) and the transparent electrode layer on the transparent substrate side has a refractive index made lower than the transparent electrode layer on the photovoltaic layer side, with respect to at least light having a wavelength at which the photovoltaic device has a maximum sensitivity.

The photovoltaic device of the present invention still further be a photovoltaic device having at least a transparent substrate, a transparent electrode layer provided thereon in close contact, a photovoltaic layer further provided thereon in close contact, and a back-surface electrode layer; wherein the transparent electrode layer comprises $Zn_\alpha In_\beta O_\gamma$ ($0<\alpha,\beta,\gamma$), and a value of $\alpha/(\alpha+\beta)$ becomes monotonously greater in that layer from the transparent substrate side toward the photovoltaic layer side but a maximum value thereof does not exceed 0.5.

The photovoltaic device of the present invention still further be a photovoltaic device having at least a transparent substrate, a transparent electrode layer provided thereon in close contact, a photovoltaic layer further provided thereon in close contact, and a back-surface electrode layer; wherein the transparent electrode layer comprises $Zn_\alpha In_\beta O_\gamma$ ($0<\alpha,\beta,\gamma$), and a value of $\beta/(\alpha\beta)$ becomes monotonously greater in that layer from the transparent substrate side toward the photovoltaic layer side but a maximum value thereof does not exceed 0.5.

The present invention will be described below in detail.

Experiment 1

Figure 3:
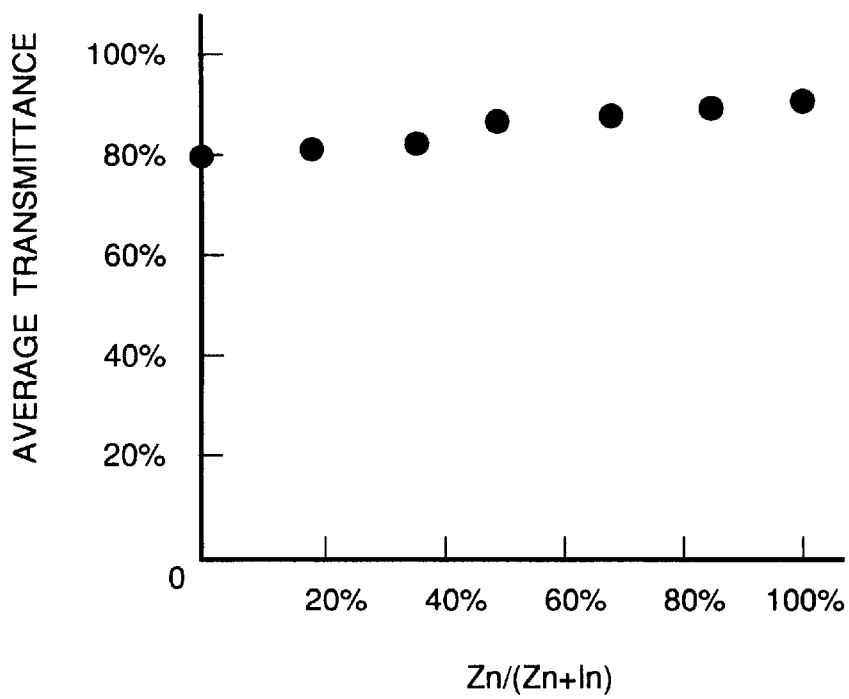
FIG. 3 is a graph showing an example of the relationship between compositional changes of a transparent conductive material and average transmittance of visible light.
Figure 4:
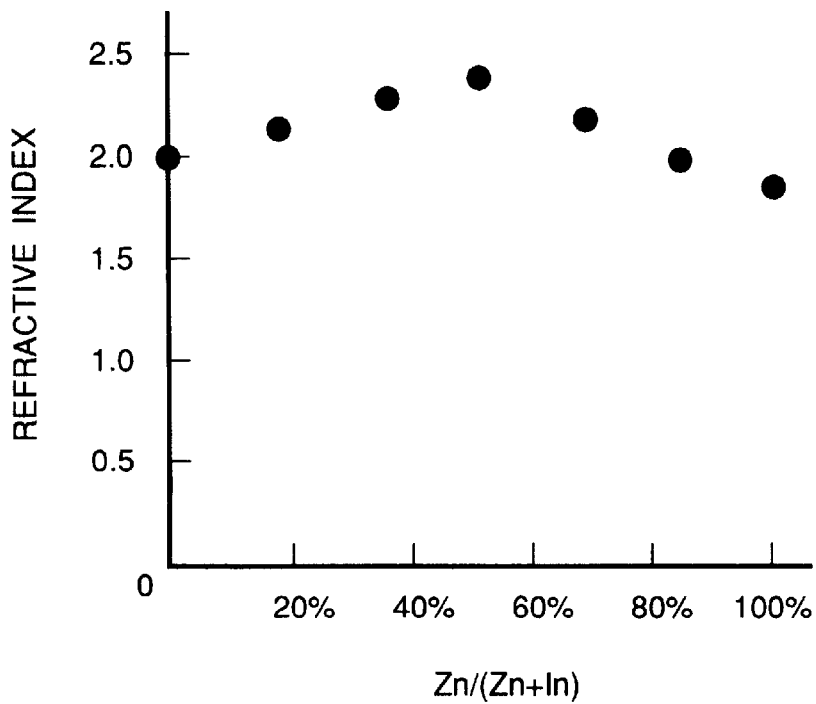
FIG. 4 is a graph showing an example of the relationship between compositional changes of a transparent conductive material and changes in refractive index.

A series of targets prepared by mixing $In_2O_3$ powder and ZnO powder in appropriate proportions were made ready for use. Using the targets, a series of $Zn_\alpha In_\beta O_\gamma$ films with a thickness of about 300 nm were deposited on transparent glass substrates (#7059 glass substrates) and Si wafers by sputtering under conditions of a pressure of 10 mTorr, an Ar flow rate of 10 sccm, an $O_2$ flow rate of 0.5 sccm, a substrate temperature of 200° C. and an RF power of 80 W. Thereafter, the films formed on the Si wafers were first compositionally analyzed by means of an X-ray microanalyzer (EMAX-5770, trade name; manufactured by Horiba Seisakusho). Next, the spectral transmittance of the films deposited on the #7059 glass substrates was measured using an integrating sphere type spectrophotometer (U-4000, an instrument manufactured by Hitachi Ltd.). Results obtained are shown in FIG. 3 as average values of transmittance, assuming as 100% the transmittance of the transparent glass substrates themselves within the wavelength range of from 400 nm to 1,000 nm. Meanwhile, the refractive indexes of the films deposited on Si wafers were measured by means of a phase difference meter (NIKON NPDM-1000MKII, trade name, manufactured by K.K. Nikon) on the assumption that they have no absorption. Refractive indexes at a wavelength of 550 nm are shown in FIG. 4. The crystallinity of films deposited on the glass substrates was also evaluated as occasion calls, using an X-ray diffractometer (RINT 2000, trade name, manufactured by Rigaku Denki K.K.).

As is seen from FIG. 3, films having larger proportions of Zn have a little higher light transmittance but with a slight difference, and have a high transmittance on the whole. As for the refractive index, while it was 2 or less even in the case of pure $In_2O_3$ or ZnO, it reached 2.4 when Zn/(Zn+In) was around 50%, as shown in FIG. 4. As a result of X-ray diffraction of this film, (100) and (101) peaks of $Zn_2In_2O_5$ were observed.

The above experimental results have revealed that this film is transparent, can be changed in refractive index within the range of from 1.9 to 2.4, and has properties desirable as a reflection preventive layer.

Experiment 2

Figure 5:
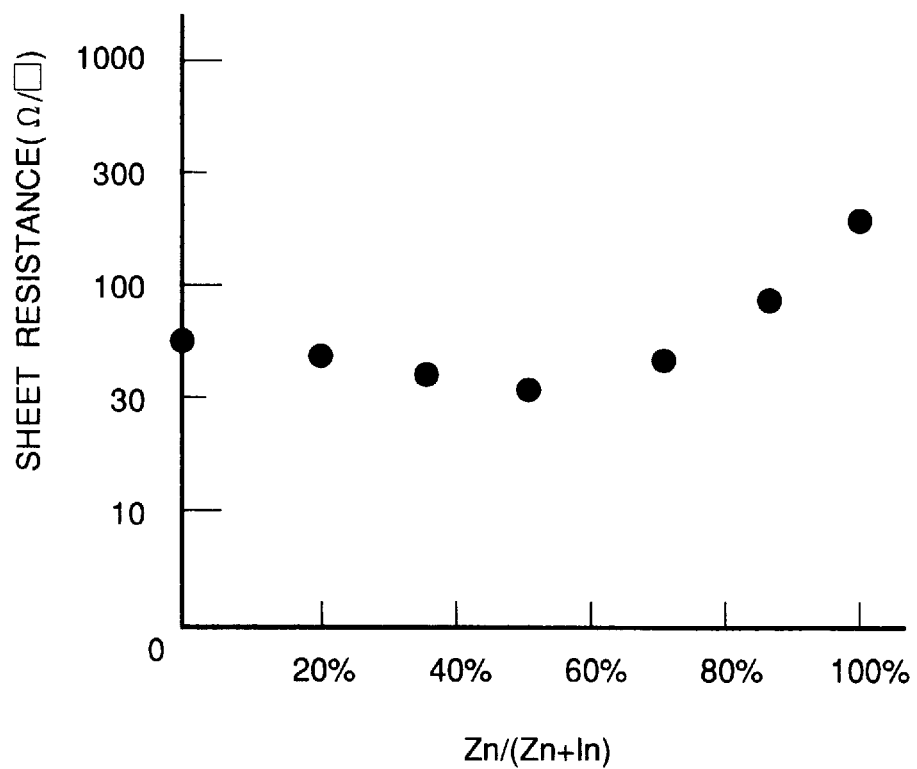
FIG. 5 is a graph showing an example of the relationship between compositional changes of a transparent conductive material and sheet resistance.

$Zn_\alpha In_\beta O_\gamma$ films with a thickness of 70 nm were deposited on transparent glass substrates in the same manner as in Experiment 1. On these films, aluminum coplanar type electrodes were formed by masked vapor deposition, and sheet resistance thereof was measured. Results obtained are shown in FIG. 5. Those coming to have a little higher resistance with an increase in the proportion of Zn are within the range of practical use.

The results of Experiments 1 and 2 have revealed that the $Zn_\alpha In_\beta O_\gamma$ has superior properties as a material for transparent electrodes.

Experiment 3

Next, as an example of the photovoltaic device, the $Zn_\alpha In_\beta O_\gamma$ was applied to an a-Si photovoltaic device. Cross-sectional structure of the photovoltaic device used in this experiment is diagrammatically shown in FIG. 6.

Figure 6:
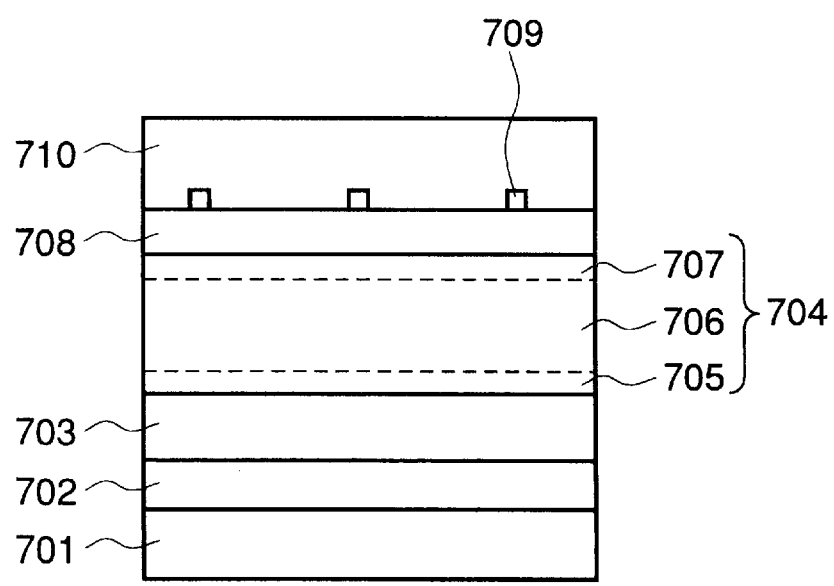
FIGS. 6, 7 and 8 are each a diagrammatic cross section to illustrate a preferred example of the photovoltaic device according to the present invention.

In FIG. 6, reference numeral 701 denotes a stainless steel substrate with a polished surface. An Ag layer 702 of 200 nm thick was deposited thereon by sputtering. A ZnO layer 703 of 1,000 nm thick was further deposited thereon by sputtering similarly. Subsequently, on the surface of the ZnO layer 703, a pin-type photovoltaic layer 704 of 400 nm thick employing a-Si was deposited by plasma-assisted CVD.

Here, reference numeral 705 denotes an n-type layer; 706, an i-type layer; and 707, a p-type layer. A $Zn_{0.38}In_{0.62}O_{1.25}$ transparent electrode layer 708 of 60 nm thick was further deposited thereon by sputtering under the same conditions as in Experiment 1 (hereinafter the compositional ratio is expressed as $\alpha+\beta=1$ unless any characteristic crystal structure is confirmed to be possessed). For taking out electric currents, a comb-shaped grid electrode 709 was further deposited thereon to make interconnection, followed by formation of a protective layer 710 of 25 μm thick, formed of acrylic urethane resin, to obtain Sample 1.

Here, the Ag layer 702 and ZnO layer 703 are back-surface reflection layers for reflecting light not absorbed in the photovoltaic layer 704 to make the photovoltaic layer 704 again absorb the light, and serve as an additional means for effectively utilizing the incident light.

Sample 2 was prepared in the same manner as Sample 1 except that, as the transparent electrode layer 708, ITO (Sn content: 5%) was deposited using the same sputtering apparatus. The ITO film formed had a refractive index of 2.0, and its thickness was controlled to be 72 nm.

Sample 3 was prepared in the same manner as Sample 1 except that the protective layer 710 was not deposited.

Sample 4 was prepared in the same manner as Sample 2 except that the protective layer 710 was not deposited.

The four sheets of samples thus obtained were tested under a standard sunlight simulator of AM 1.5 to evaluate photoelectric conversion efficiency. Results of measurement are shown in Table 1 below as relative values with respect to the characteristics of Sample 1 (i.e., regarding the value of Sample 1 as 100). Here, the magnitude of Jsc (short-circuit photoelectric current) chiefly depends on the utilization rate of incident light absorbed in the a-Si layer, the photovoltaic layer 704. In all the samples, layers other than the transparent electrode layer 708 and protective layer 710 are common, and their Voc (open end voltage) and FF (curve factor) are considered to be equal to each other, and hence, the conversion efficiency that is a product of Jsc, Voc and FF is also considered to depend on the utilization rate of incident light so long as no other factor is present.

TABLE 1

| Sample | Transparent electrode | Protective layer | Jsc | Conversion efficiency |
|---|---|---|---|---|
| 1 | $Zn_{0.38}In_{0.62}O_{1.25}$ | Present | 100 | 100 |
| 2 | ITO | Present | 94 | 95 |
| 3 | $Zn_{0.38}In_{0.62}O_{1.25}$ | None | 97 | 96 |
| 4 | ITO | None | 102 | 101 |

As is seen from Table 1, the use of ITO as the transparent electrode layer 708 brings about a decrease in conversion efficiency because the protective layer 710 is provided, and on the other hand the use of $Zn_{0.38}In_{0.62}O_{1.25}$ as the transparent electrode layer 708 brings about an improvement in characteristics because the protective layer 710 is provided. This is presumably because the ITO has an optimum refractive index for the combination of air with the a-Si layer (refractive index: 3.4), whereas the $Zn_{0.38}In_{0.62}O_{1.25}$ has an optimum refractive index for the combination of the protective layer 710 (refractive index: 1.5) with the a-Si layer.

Experiment 4

Sample 5 was prepared in the same manner as Sample 1 except that ZnS doped with 1% of Al, deposited by sputtering, was used as the transparent electrode layer 708. Here, the refractive index of ZnS was same as that of $Zn_{0.38}In_{0.62}O_{1.25}$, and hence its thickness was also set to be 60 nm similarly. Measurement was made in the same manner as in Experiment 3 to obtain the results as shown in Table 2 below.

TABLE 2

| Sample | Transparent electrode | Protective layer | Jsc | Conversion efficiency |
|---|---|---|---|---|
| 1 | $Zn_{0.38}In_{0.62}O_{1.25}$ | Present | 100 | 100 |
| 5 | ZnS | Present | 101 | 93 |

Here, although Sample 5 had a rather higher Jsc, it showed a fairly low conversion efficiency. This is presumably because, although it was attempted to make resistance lower by Al doping, the sheet resistance of ZnS was higher by two figures than that of $Zn_{0.38}In_{0.62}O_{1.25}$.

As having been explained above, the present invention makes it possible to achieve a higher conversion efficiency in the state the photovoltaic device is actually used (i.e., in the state the protective layer is provided). The materials used also have no particular factors of cost increase, compared with transparent electrode materials conventionally used. As will be also seen from the foregoing explanation on the principle of the invention and the following explanation on the embodiments thereof, the present invention can be applied to a-Si photovoltaic devices in which layers are deposited on a transparent substrate and light is made incident on the substrate side and also to photovoltaic devices of various types such as Si, GaAs and InP, and hence have a very high utility.

The present invention is the photovoltaic device comprising a back-surface electrode layer, a photovoltaic layer, a transparent electrode layer provided on the photovoltaic layer in close contact, and a transparent protective layer further provided thereon, or the photovoltaic device comprising a transparent substrate, a transparent electrode layer provided thereon in close contact, a photovoltaic layer further provided thereon in close contact, and a back-surface electrode layer; wherein the transparent electrode layer comprises $Zn_\alpha In_\beta O_\gamma$ (0<$\alpha,\beta,\gamma$). The transparent electrode layer may be either a single layer or a combination of at least two layers having different refractive indexes. When it is a single layer, it may be a layer made to have different refractive indexes by continuously changing the composition of $Zn_\alpha In_\beta O_\gamma$ (0<$\alpha,\beta,\gamma$).

When the transparent electrode layer is comprised of a single layer, in order to establish the relationship of the expression (2), the layer must be made to have a thickness which is ¼n of the wavelength of light to which the photovoltaic device has a maximum sensitivity, where n is a refractive index of the transparent protective layer at that wavelength. In the case when, e.g., the photovoltaic layer (in particular, the outermost surface side of the semiconductor material) has a refractive index of 3.2 or above and the protective layer or transparent substrate has a refractive index of 1.3 or above with respect to at least the light having a wavelength at which the photovoltaic device has a maximum sensitivity, the transparent electrode layer may preferably has composition wherein $\alpha=2$, $\beta=2$ and $\gamma=5$. This is because, when it has such composition, it has a higher refractive index as is seen from FIG. 4 and an ideal value showing less reflection loss, which is determined from the expression (1), can be obtained. Also, when it has such composition, the layer has a lower sheet resistance as is seen from FIG. 5, thus any loss due to resistance can be small and, conjointly therewith, a high conversion efficiency can be achieved.

When the transparent electrode layer is constituted of at least two layers, the reflection loss can be decreased in respect of light in a broader wavelength range. In this case, with respect to at least the light having a wavelength at which the photovoltaic device has a maximum sensitivity or a wavelength adjacent thereto, a first transparent electrode layer must be made to have a refractive index lower than the refractive index of a second transparent electrode layer so that layers can have less difference in refractive index between the protective layer or transparent substrate and the first transparent electrode layer, between the first transparent electrode layer and the second transparent electrode layer, and between the second transparent electrode layer and the photovoltaic layer. The $Zn_\alpha In_\beta O_\gamma$ can provide layers with different refractive indexes by its compositional control, and hence can be used in either the first transparent electrode layer or the second transparent electrode layer. The transparent electrode layer constituted of two layers can be more effective when the first transparent electrode layer and the second transparent electrode layer have a greater difference in refractive index, and hence as the second transparent electrode layer it is effective to use $Zn_2In_2O_5$ having a higher refractive index.

When the transparent electrode layer is comprised of the layer made to have continuously different refractive indexes, the value of $\alpha/(\alpha+\beta)$ or $\beta/(\alpha+\beta)$ becomes monotonously greater in that layer from the protective layer side or transparent substrate side toward the photovoltaic layer side but a maximum value thereof may preferably not exceed 0.5. Controlling the value of $\alpha/(\alpha+\beta)$ or $\beta/(\alpha+\beta)$ to be made monotonously greater so that a maximum value thereof does not exceed 0.5 makes the transparent electrode layer have a refractive index made continuously greater, as is seen from FIG. 4. The reason why the refractive index is made continuously greater from the protective layer side or transparent substrate side toward the photovoltaic layer side is presumed to be the same as the case when the two layers having different refractive indexes are formed in combination.

In the following, typical constitution of the photovoltaic device preferable for working the present invention will be described in detail.

(a-Si Photovoltaic Device Employing Metal Substrate)

An a-Si photovoltaic device formed on a metal substrate will be described with reference to FIG. 6. A variety of metal substrates may be used as the substrate 701. In particular, stainless steel sheets, zinc steel sheets, chrome-plated steel sheets, nickel-plated steel sheets, aluminum sheets and copper sheets are relatively inexpensive and are preferred. These substrates may be cut into stated shapes when used, or may be used in the form of a continuous sheet. In the latter case, the substrate may be wound up in a roll, and a method in which various layers are successively deposited (the roll-to-roll method) can be applied. Hence, such a method is suited for continuous production, and also makes storage and transportation easy. The surface of the substrate may be polished. When, however, the substrate is well finished as in a stainless steel sheet treated by bright annealing, it may be used as it is.

In the case of substrates of metals having a conductivity in themselves and having a high reflectance as in aluminum sheets or copper sheets, the substrate may serve also as the back-surface electrode layer. In general, a metal having a high reflectance, such as Ag, Cu or Al, may be deposited as the back-surface electrode layer 702, whereby the light having not been absorbed in the photovoltaic layer 704 can be effectively reflected so as to be again absorbed in the photovoltaic layer 704. The back-surface electrode layer 702 may be deposited by vacuum deposition utilizing resistance heating or electron beams, sputtering, ion plating, CVD, or plating. In particular, sputtering is a method that can be used with ease because of a high through-put, easy deposition on a large area and also a good adhesion of deposited films to substrates, and will be detailed later in Examples. A magnetron sputtering apparatus internally provided with a magnet so as to enhance the strength of plasma can make the deposition rate higher. Whatever methods are used, the surface irregularities of the back-surface electrode layer 702 generally tend to become greater with an elevation of temperature (Ts) of the substrate 701, so that the layer comes to have a textured structure effective for entrapment of light in the photovoltaic layer 704, making it possible to obtain a large Jsc.

A transparent layer 703 is deposited on the back-surface electrode layer 702. The transparent layer 703 has the function to, e.g., prevent the metal of the back-surface electrode layer 702 and the photovoltaic layer 704 from coming into direct contact to react or, even if pinholes have occurred in the photovoltaic layer, prevent excessive leak currents from flowing. Usually, the higher the light transmittance of the transparent layer 703, the better. This condition, however, need not be made up with respect to light having a wavelength completely absorbed in the photovoltaic layer 704. Meanwhile, it need not be also made up with respect to light having a wavelength not absorbed at all in the photovoltaic layer 704. For example, in respect of a-Si, the layer can be usually satisfactory so long as it has a high transmittance to light having a wavelength in the wavelength range of from 600 to 850 nm, and, in respect of a-SiGe, so long as it has a high transmittance to light having a wavelength in the wavelength range of from 650 to 1,000 nm. It is better for the transparent layer 703 to have a certain degree of resistance in order to suppress electric currents caused by leak at the photovoltaic layer 704. It, on the other hand, is desirable for that layer to have a resistance low enough to be negligible for any effect caused by series resistance loss on the conversion efficiency of the photovoltaic device. Thus, ITO, ZnO, ZnS, $TiO_2$ or the like may preferably be used. The transparent layer 703 may also be deposited by vacuum deposition utilizing resistance heating or electron beams, sputtering, ion plating, CVD, or plating. Also when the back-surface electrode layer 702 is smooth, the surface of the transparent layer 703 may be made to have a textured structure, so that the effect of entrapment of light in the photovoltaic layer 704 is produced, making it possible to obtain a large Jsc.

The photovoltaic device 704 will be described below with reference to an instance where a-Si type materials such as a-Si:H, a-SiGe:H and a-SiC:H are used. Similar constitution is also applicable to semiconductors that can be deposited on substrates made of thin-film crystalline Si or CdS/CdTe type materials and chalcopyrite type materials such as CdTe/$CuInSe_2$.

Reference numeral 705 denotes an n-type semiconductor layer formed of a-Si doped with P or As. It may be formed usually in a thickness of about 10 to 50 nm. Reference numeral 706 denotes an i-type semiconductor layer formed of a-Si, a-SiGe or a-SiC. It may be formed usually in a thickness of about 50 to 1,000 nm. Reference numeral 707 denotes a p-type semiconductor layer formed of a-Si, a-SiC, microcrystalline ($\mu$c)-Si or $\mu$c-SiC doped with B, Ga or In. It may be formed usually in a thickness of about 5 to 20 nm. The respective p-, i- and n-type layers (705, 706, 707) act together as a set to generate photovoltaic force.

Such a set of pin (a cell) may be made up in two sets. In such an instance, a-SiGe having a strong absorption of long-wavelength light may be used in the i-type semiconductor layer on the substrate 701 side cell (the bottom cell), and a-Si or a-SiC having less absorption of long-wavelength light but having a high output voltage may be used in the i-type semiconductor layer on the transparent electrode layer 708 side, whereby a high conversion efficiency can be obtained. In the case of such a cell (a tandem cell) and a cell superposingly formed of three pin sets (a triple cell), the cell nearest to the transparent electrode layer 708 side may be taken into account.

The photovoltaic layer 704 is deposited by plasma-assisted CVD as will be described later in Example 1. In order to improve production efficiency, the roll-to-roll method may be used. A CVD process carried out by the roll-to-roll method is disclosed in detail in U.S. Pat. No. 4,492,181. An example in which a microwave film forming process effective for depositing the photovoltaic layer 704 in a high rate is applied to the roll-to-roll method is disclosed in detail in Japanese Patent Application Laid-open No. 3-30419.

Reference numeral 708 denotes the transparent electrode layer, which is formed of the $Zn_\alpha In_\beta O_\gamma$ ($0<\alpha,\beta,\gamma$). How the transparent electrode layer 708 functions is the main point of the present invention, and has been described in detail in Experiments 1 to 4. This layer may be deposited by the sputtering as described in Experiment 1, in which a series of targets prepared by mixing $In_2O_3$ powder and ZnO powder in appropriate proportions, and besides by reactive sputtering in which an alloy film deposited using a target formed of an alloy of Zn and In and adding about 10 to 50% of oxygen to Ar as sputtering gas is oxidized to obtain the $Zn_\alpha In_\beta O_\gamma$ ($0<\alpha,\beta,\gamma$). In the latter case, it is also possible to use vacuum deposition utilizing resistance heating or electron beams, ion plating, or CVD. In the following description, the present invention will be described only with reference to the sputtering (including the reactive sputtering).

Reference numeral 709 denotes a grid electrode, and is formed to collect electric currents from the whole surface of the transparent electrode layer 708 to a take-out electrode (not shown). This may be printed using a conductive paste or formed further using metal wires.

Reference numeral 710 denotes a protective layer, and is provided to protect the surface of the photovoltaic device. Glass may be used therefor, which is advantageous in that moisture can be almost perfectly prevented from invading. In order to make the most of the use of metal substrates, films of acrylic resin, polycarbonate or fluorine resin may be used. In order to bond such films, polyurethane resin, PVC (polyvinyl chloride), PVA (polyvinyl alcohol), EVA (ethylene vinyl acetate) or the like may be used. These materials generally have a refractive index of 1.3 with repect to visible light, and hence, when conventional transparent electrodes are used, no sufficient reflection preventive effect can be obtained whatever optimum layer thickness is selected according to the expression (2) or (4)–(4').

(a-Si Photovoltaic Device Employing Glass Substrate)

Figure 7:
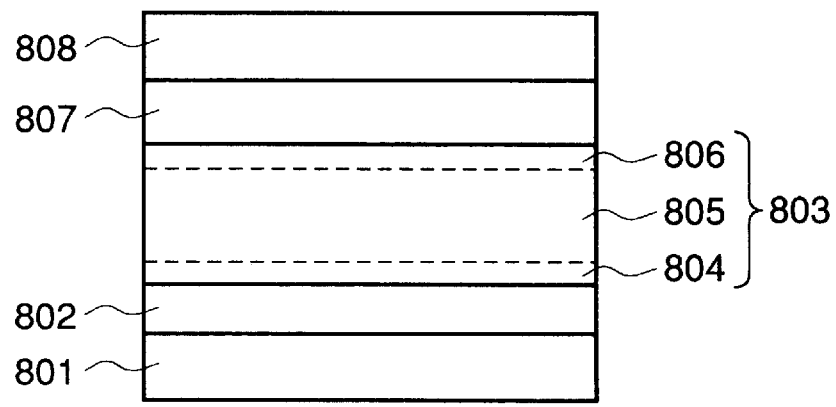

FIG. 7 is a diagrammatic cross section to illustrate a preferred example of the constitution of a photovoltaic device formed on a transparent substrate such as glass. Reference numeral 801 denotes a glass substrate. From the viewpoint of reliability, it may preferably be made of glass containing no alkali, such as #7059 Glass, available from Corning Glass Works. Even glass containing an alkali may be used without any problem if a coat layer formed of $SiO_2$ or the like is provided on its surface. In such constitution, light may be made incident on the glass substrate 801 side, whereby a photovoltaic layer 803 can be protected from the exterior even if any particular protective layer is not provided. Such glass, however, has a refractive index of about 1.4 to 1.6, and no suitable reflection preventive conditions for the photovoltaic layer 803 formed of Si or the like can be obtained if conventional transparent electrode materials are used. Accordingly, for the same reasons stated in respect of the above protective layer, the $Zn_\alpha In_\beta O_\gamma$ ($0<\alpha,\beta,\gamma$) of the present invention can be preferably used as a material for the transparent electrode layer 802.

The photovoltaic layer 803 will be described with reference to an instance where a-Si type materials such as a-Si:H, a-SiGe:H and a-SiC:H are used. In this instance too, similar constitution is applicable to semiconductors that can be deposited on substrates made of thin-film crystalline Si or CdS/CdTe type materials and chalcopyrite type materials such as $CuInSe_2$. Here, reference numeral 804 denotes a p-type semiconductor layer formed of a-Si, a-SiC, microcrystalline ($\mu c$)-Si or $\mu c$-SiC doped with B, Ga or In. Reference numeral 805 denotes an i-type semiconductor layer formed of a-Si, a-SiGe or a-SiC. Reference numeral 806 denotes an n-type semiconductor layer formed of a-Si doped with P or As. The respective p-, i- and n-type layers (804, 805, 806) act together as a set to generate photovoltaic force. In this instance too, the layers may be constituted as a tandem cell or a triple cell.

Reference numeral 807 denotes a transparent layer corresponding to the transparent layer 703 in FIG. 6. This layer may be omitted, but may preferably be provided from the viewpoint of reliability. ITO, ZnO, ZnS, $TiO_2$ or the like may be used to form the layer.

Reference numeral 808 denotes a back-surface electrode layer corresponding to the back-surface electrode layer 702. Metal having a high reflectance, such as Ag, Cu and Al, may preferably be used to form the layer.

(Crystalline Si Photovoltaic Device)

Figure 8:
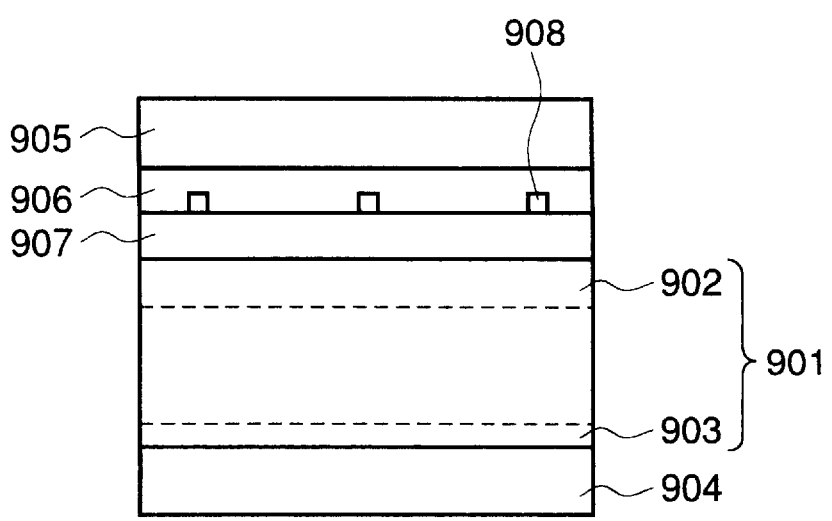

FIG. 8 is a diagrammatic cross section to illustrate a preferred example of the constitution of a crystalline Si photovoltaic device. Reference numeral 901 denotes a crystalline wafer. In either single-crystal wafers or polycrystalline wafers, they may have the same fundamental structure. Weakly p-type wafers are usually used. Reference numeral 902 denotes a region doped to have an n-type, and a pn junction is formed at the boundary between the n-type region and an original p-type region. The doping to provide the n-type is carried out by heat diffusion or ion implantation. Reference numeral 903 denotes a $p^+$-type region (back-surface region) for forming what is called back-surface junction, and this region is usually formed by heat diffusion of Al from an Al back-surface electrode layer 904. Reference numeral 905 denotes a protective glass, to which the wafer 901 is stuck with a resin 906 such as PVA. In this instance too, the protective glass 905 and resin 906 have a refractive index of about 1.3 to 1.6, thus the use of the $Zn_\alpha In_\beta O_\gamma$ ($0<\alpha,\beta,\gamma$) as a material for the transparent electrode layer 907 can bring about an improvement in conversion efficiency.

Incidentally, reference numeral 908 denotes a grid electrode corresponding to the grid electrode 709 in FIG. 6. The above respective p-type and n-type may be in reverse order.

EXAMPLES

The present invention will be described below in greater detail by giving Examples.

[Example 1]

The photovoltaic device constituted as shown in FIG. 7 was produced. Here, reference numeral 801 denotes a soda-lime glass substrate whose surface was coated with $SiO_2$ in a thickness of 1,000 angstroms (the coat layer is not shown). The surface of this glass had a refractive index of 1.45 with respect to light having a wavelength 550 nm. The transparent electrode layer 802 was deposited on this substrate.

Figure 9:
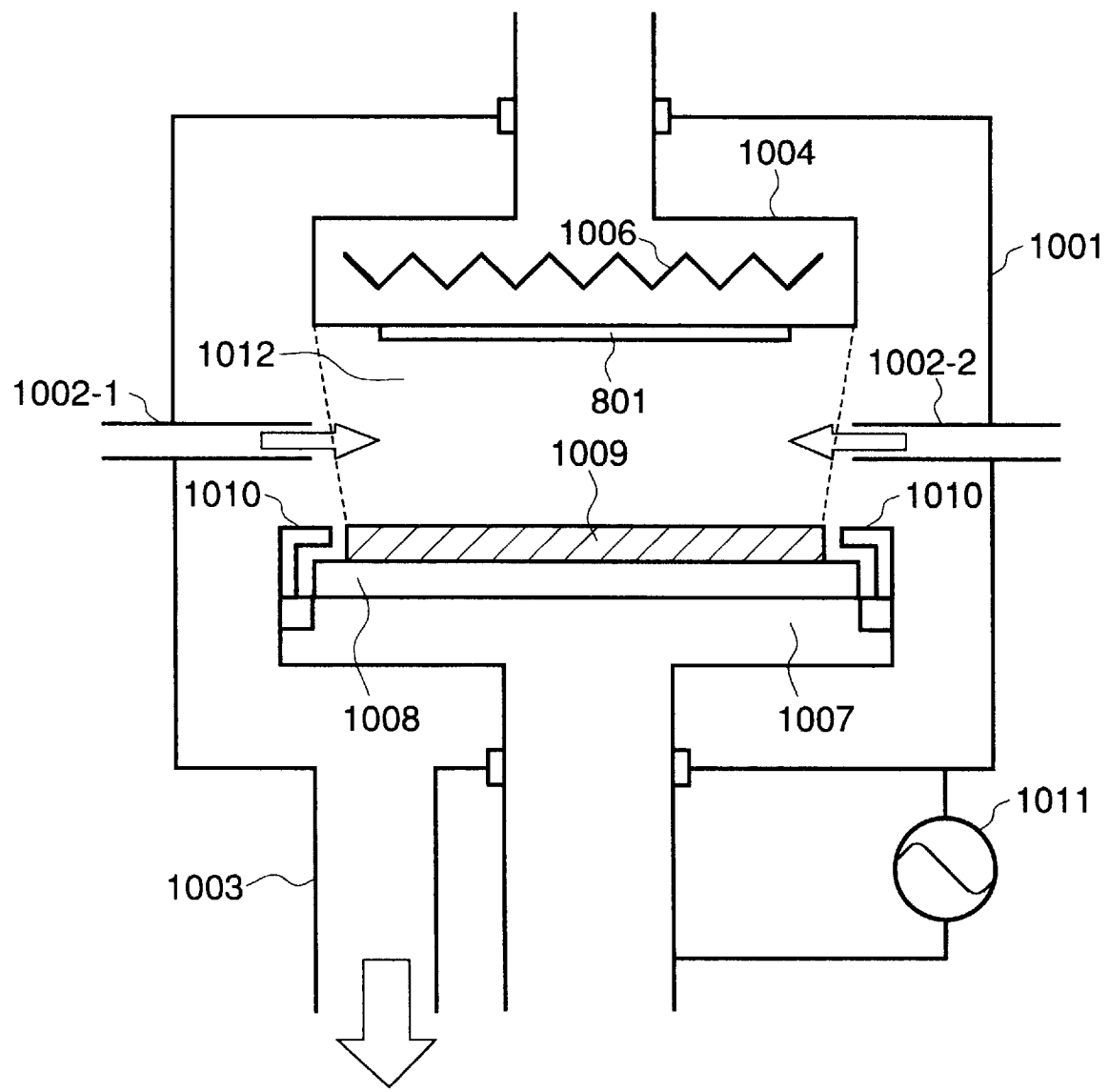

FIG. 9 illustrates the constitution of a sputtering apparatus preferable for depositing the transparent electrode layer 802. This apparatus is so designed that Ar gas is fed through a pipe 1002-1 into a chamber 1001 that can be evacuated, and $O_2$ gas can be fed through a pipe 1002-2, and also that the chamber 1001 can be evacuated through a pipe 1003 by means of a vacuum pump (not shown). To a substrate support 1004, the glass substrate 801 is secured, and a heater 1006 is provided so that the substrate can be optionally heated. To a target support 1007 provided opposingly to the substrate support, a target 1009 stuck to a backing plate 1008 is secured. Guard electrodes 1010 made to have a potential equal to that of the chamber 1001 is provided so that the part other than the surface of the target 1009 is not sputtered. A water cooling mechanism (not shown) is provided in the target support 1007 so that the target 1009 can be optionally cooled. A power source 1011 is connected to the target support 1007 so that DC or high-frequency (RF) voltage can be applied.

While flowing Ar or $O_2$ gas, the inside of the chamber 1001 is evacuated. While keeping its internal pressure at a stated value, a voltage is applied to the target support 1007, so that plasma 1012 is generated at the space between the target 1009 and the substrate support 1004. To deposit a thin film on the substrate 801, a negative DC voltage or RF voltage is applied from the power source 1011 so that the surface of the target 1009 is bombarded with positively charged Ar ions present in the plasma.

Formation of a ZnInO film will be described below.

The same $In_2O_3$ powder and ZnO powder as used in Experiment 1 (each having a purity of 99.99%) were well mixed in appropriate amount by agitation, followed by hot pressing to prepare a series of targets. Among the targets, a sheet of desired target was selected and set on the target support. In this state, 50 sccm (50 cc as standard cubic centimeter per minute) of Ar and 2 sccm of $O_2$ were introduced into the chamber 1001. Meanwhile, the inside of the chamber 1001 was evacuated through the pipe 1003, where the evacuation rate was controlled to keep the internal pressure of the chamber 1001 at 10 mTorr. At this stage, a voltage of −400 V was applied from the power source 1011, whereupon plasma 1012 was generated. In this state, discharging was maintained for about 60 seconds, and thereafter the application of voltage was stopped. Thus, the transparent electrode layer 802 was deposited on the surface of the glass substrate 801 in a thickness of about 700 angstroms. Here, the deposition time was controlled so that the thickness of the transparent electrode layer 802 as calculated according to the expression (2) made minimum the reflection at a wavelength of 550 nm. After the deposition was completed, the Ar gas and $O_2$ gas were stopped being fed into the chamber 1001.

Subsequently, this glass substrate 801 with the layer 802 was set in a commercially available capacitive coupling type high-frequency CVD apparatus. The inside of the reactor was roughly evacuated and then drawn to a high vacuum through its exhaust pipe by means of a vacuum pump. During this evacuation, the surface temperature of the substrate was controlled by a temperature control mechanism so as to be 250° C. At the time the reactor was well evacuated, 50 sccm of $SiH_4$, 10 sccm of PH3/H2 (diluted with 1% of H2) and 40 sccm of H2 were fed into the reactor through a gas feed pipe. The opening of a throttle valve was adjusted to keep the internal pressure of the reactor at 1 Torr, and 50 W of power was applied from a high-frequency power source. Plasma was maintained for 2 minutes to form an n-type a-Si layer 804 on the transparent electrode layer 802. After the deposition was completed, the starting gases were stopped from being fed.

Next, after the inside of the reactor was again evacuated, 50 sccm of $SiH_4$, 25 sccm of $GeH_2$ and 100 sccm of H2 were fed into the reactor through the gas feed pipe. The opening of the throttle valve was adjusted to keep the internal pressure of the reactor at 1 Torr, and 50 W of power was applied from the high-frequency power source. Plasma was maintained for 40 minutes. Thus, an i-type a-SiGe layer 805 was formed on the n-type a-Si layer 804.

Next, after the inside of the reactor was again evacuated, 10 sccm of $SiH_4$, 20 sccm of BF3/H2 (diluted with 1% of H2) and 100 sccm of H2 were fed into the reactor through the gas feed pipe. The opening of the throttle valve was adjusted to keep the internal pressure of the reactor at 1 Torr, and 100 W of power was applied from the high-frequency power source. Plasma was maintained for 2 minutes to deposit a p-type $\mu$c-Si layer 806 on the i-type a-Si layer 805.

Then, the sample obtained was taken out of the high-frequency CVD apparatus, and set in the same sputtering apparatus as that shown in FIG. 9, where a ZnO transparent layer of 3,000 angstroms thick and also an Al back-surface electrode layer 808 of 2,000 angstroms thick were each deposited using the desired target. A series of photovoltaic devices were produced by changing the composition of the transparent electrode layer, and their characteristics were measured under irradiation by light of AM 1.5 (100 mW/cm$^2$). Results obtained are shown in Table 3 below.

TABLE 3

| Sample | Composition of transparent electrode | Jsc | Conversion efficiency |
|---|---|---|---|
| 6 | $In_{1.0}O_{1.5}$ (=$In_2O_3$) | 100 | 100 |
| 7 | $Zn_{0.16}In_{0.84}O_{1.40}$ | 102 | 102 |
| 8 | $Zn_{0.30}In_{0.70}O_{1.33}$ | 104 | 105 |
| 9 | $Zn_{0.50}In_{0.50}O_{1.25}$ (=$Zn_2In_2O_5$) | 106 | 107 |
| 10 | $Zn_{0.68}In_{0.32}O_{1.13}$ | 103 | 103 |
| 11 | $Zn_{0.85}In_{0.15}O_{1.06}$ | 101 | 99 |
| 12 | $Zn_{1.0}O_{1.0}$ (=ZnO) | 99 | 97 |

Of these, Sample 9 (making use of $Zn_2In_2O_5$) has the highest Jsc. In comparison with the results shown in FIG. 4, the transparent electrode show the highest refractive index here, and hence the reflection preventive conditions represented by the expression (1) are considered to be most perfectly made up.

[Example 2]

Figure 2:
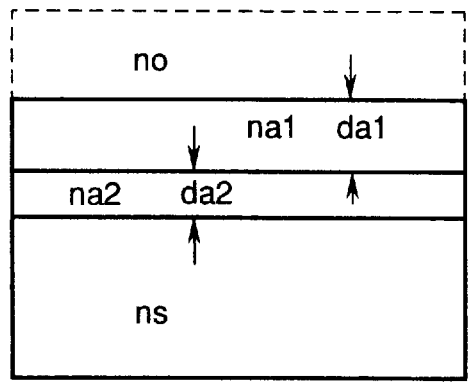
Figure 10:
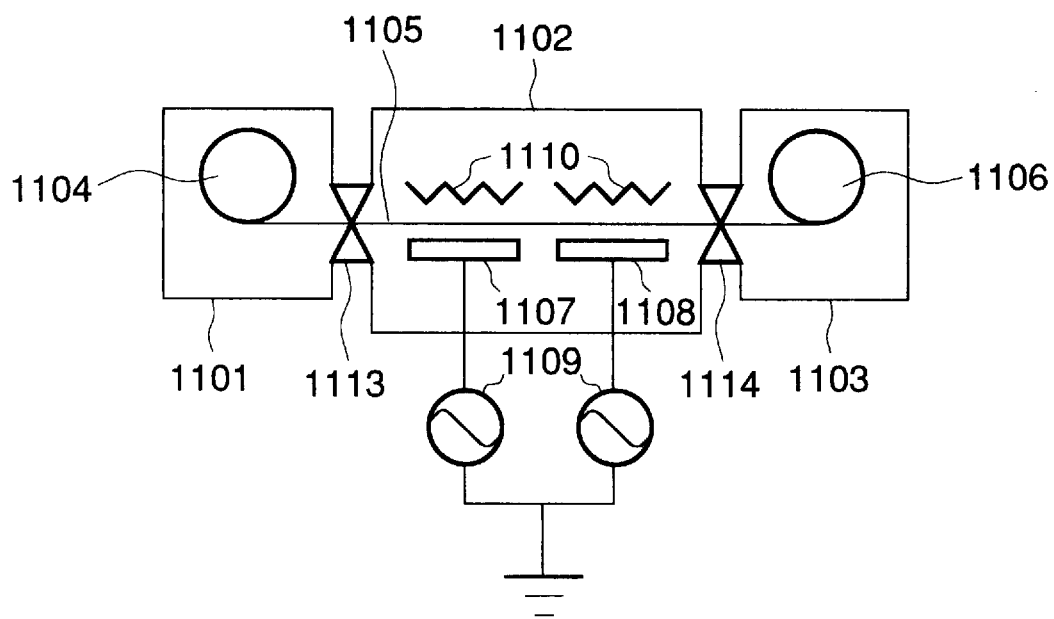

In the present Example, the photovoltaic device constituted as shown in FIG. 2 was produced using a roll-to-roll system, suited for mass production. On an aluminum sheet of 350 mm wide and 0.2 mm thick, a-Si n-type, i-type and p-type layers were deposited in this order while continuously transporting the sheet, using the roll-to-roll type CVD apparatus as disclosed in U.S. Pat. No. 4,492,181. A coil 1104 of the sheet wound up was set in a roll-to-roll type sputtering apparatus as shown in FIG. 10.

The coil 1104 of the sheet having the a-Si n-type, i-type and p-type layers deposited thereon was set in a load chamber 1101. Here, an end of a new web of the sheet was welded to the tail end of another coil 1106 of sheet on which deposition was completed and one end of which was nipped at a web gate 1113. Next, the load chamber 1101 and an unload chamber 1103 was evacuated, and thereafter the web gate 1113 and another web gate 1114 were opened to start to transport at a speed of 25 cm per minute the aluminum sheet 1105 having the a-Si n-type, i-type and p-type layers deposited thereon. Reference numeral 1107 in a deposition chamber 1102 denotes a target for the deposition of $In_2O_3$. Reference numeral 1108 denotes a target for the deposition of $Zn_2In_2O_5$. In the deposition chamber 1102, piping for feeding gases and piping for evacuation are provided as desired (not shown). In this state, 100 sccm of Ar and 5 sccm of $O_2$ were each fed into the deposition chamber 1102 having the targets 1107 and 1108. Then, the aluminum sheet 1105 was heated by means of a heater 1110 so as to have a sheet temperature of 200° C. Subsequently, a DC voltage was applied from a power source 1109 to the respective targets to cause glow discharge to take place, and, on the aluminum sheet 1105 having the a-Si n-type, i-type and p-type layers deposited thereon, firstly a $Zn_2In_2O_5$ layer and secondly an $In_2O_3$ layer were deposited in a thickness of 680 nm and 810 nm, respectively, according to the expression (4).

At the time these films have been deposited on the almost whole area of the sheet roll 1104 on which the deposition of the transparent electrode had been completed, the web is nipped at the web gates 1113 and 1114. While keeping the vacuum of the inside of the deposition chamber 1102, the coil 1106 of the sheet on which the deposition has been completed can be taken out and also a new coil 1104 can be set in, and hence the deposition chamber 1102 can be kept from exposure to the atmosphere. Thus, any contamination due to impurities and any separation of films from some portions in the deposition chamber 1102 can be prevented, and the productivity can be improved.

Thereafter, the transparent electrode layer was patterned and the grid electrodes were formed. Thereafter, the sheet was cut, and as a protective layer a hard coat layer was formed by coating to obtain Sample 13. In this way, the process was continuously carried out in its main part, and it was possible to achieve the effect of mass production.

Meanwhile, for comparison, Sample 14 was obtained in the same manner as Sample 13 except that an ITO target was attached to the target 1107 and an ITO layer of 690 angstroms thick was deposited as the transparent electrode layer without use of the target 1108 and according to the expression (2). Sample 15 was also obtained in the same manner as Sample 13 except that a target for $Zn_2In_2O_5$ was attached to the target 1107 and a $Zn_2In_2O_5$ layer of 570 angstroms thick was deposited as the transparent electrode layer without use of the target 1108 and according to the expression (2). Thereafter, their characteristics were measured under irradiation by light of AM 1.5 (100 mW/cm$^2$) to make evaluation. Results obtained are shown in Table 4 below.

TABLE 4

| Sample | Composition of transparent electrode | Jsc | Conversion efficiency |
|---|---|---|---|
| 13 | $Zn_2In_2O_5/In_2O_3$ | 100 | 100 |
| 14 | ITO | 92 | 91 |
| 15 | $Zn_2In_2O_5$ | 96 | 96 |

As described above, in the case when the protective layer is provided on the surface, the Jsc is higher and the conversion efficiency is enhanced when the $Zn_2In_2O_5$ layer is used (Sample 15) as the transparent electrode layer than when the ITO layer is used (Sample 14). It, however, has been found that the characteristics can be much more improved when the two layers having different refractive indexes are used (Sample 13).

[Example 3]

Figure 11A:
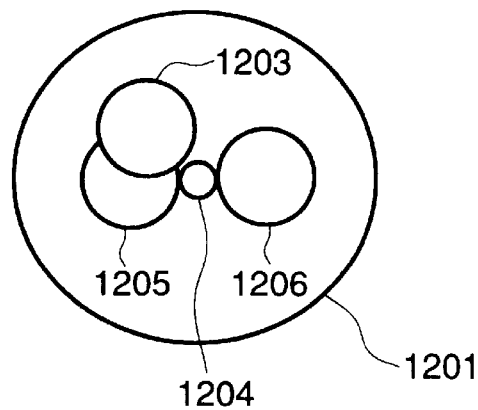
Figure 11B:
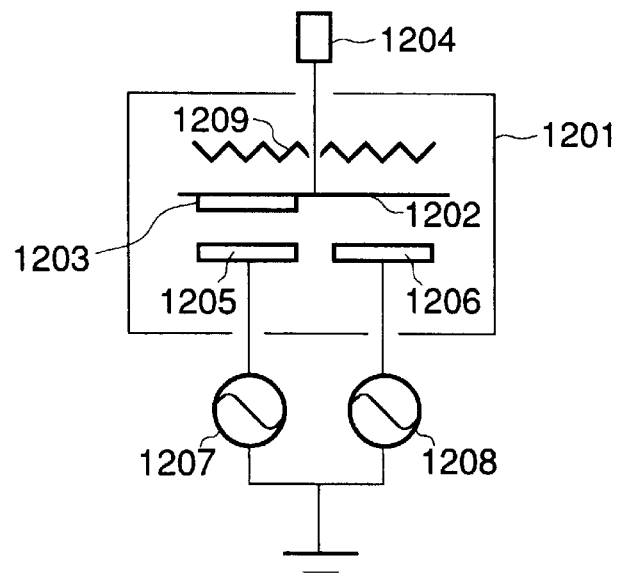
Figure 12:
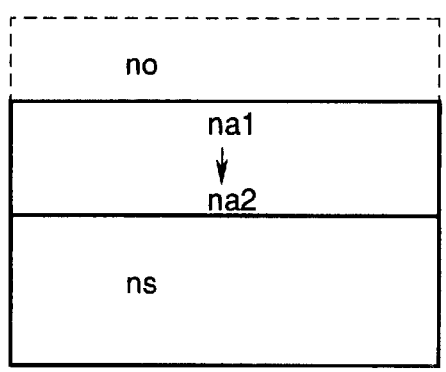

On the substrate on which the a-Si p-type layer had been deposited in the same manner as in Sample 1, the transparent electrode layer constituted as shown in FIG. 12 was deposited by the use of a sputtering apparatus as shown in FIGS. 11A and 11B. In FIGS. 11A and 11B, reference numeral 1201 denotes a chamber that can be evacuated, and targets 1205 and 1206 are disposed in it. A substrate 1203 is secured to a rotating holder 1202 (not shown in FIG. 11A), which is rotated by means of a motor 1204 so that the substrate can be alternately passed over the targets 1205 and 1206. Voltages are applied to the targets 1205 and 1206 from power sources 1207 and 1208, respectively. The substrate 1203 can be heated on the back by means of a heater 1209 (not shown in FIG. 11A).

The target 1205 is a target of $Zn_2In_2O_5$. The target 1206 is a target of $In_2O_3$. Using this apparatus, and firstly using only the target 1205, $Zn_2In_2O_5$ was deposited in a thickness of 680 nm according to the expression (4) on the substrate on which the a-Si p-type layer had been deposited. Next, using the target 1206, $In_2O_3$ was deposited in a thickness of 810 nm. Thereafter, the transparent electrode layer was patterned, the grid electrode was formed and, as a protective layer, a hard coat layer was formed by coating in a thickness of $50\mu$ to obtain Sample 16.

To obtain another sample, the target 1205 was replaced with a ZnO target. On the substrate on which the a-Si p-type layer had been again deposited, $Zn_\alpha In_\beta O_\gamma$ ($0<\alpha,\beta,\gamma$) was deposited under simultaneous application of voltages to the ZnO target 1205 and the target 1206.

In the sputtering, ZnO and $In_2O_3$ are alternately deposited on the substrate in practice. Since, however, the substrate is fast rotated (10 r.p.m.), the reaction of ZnO with $In_2O_3$ takes place on the substrate, so that the $Zn_\alpha In_\beta O_\gamma$ ($0<\alpha,\beta,\gamma$) can be deposited, like the case when a target of a mixture of ZnO and $In_2O_3$. The composition of the transparent electrode layer can also be controlled by changing the balance of voltages applied to the targets 1205 and 1206.

First, simultaneously using the targets 1205 and 1206, the deposition was started under conditions where the $Zn_2In_2O_5$ was deposited. During this deposition, RF power applied to the targets 1205 and 1206 was 200 W for each. Thereafter, the power applied to the target 1206 was decreased at a rate of 1 W per second to carry out discharging for 3 minutes. In this way, a transparent electrode layer whose composition was continuously changed in the layer thickness direction was deposited in a thickness of about 1,500 angstroms. At the outermost surface, the composition of the transparent electrode layer was $Zn_{0.09}In_{0.91}O_{1.42}$. The subsequent procedure for the preparation of Sample 16 was repeated up to the formation of the protective layer, to obtain Sample 17.

To obtain still another sample, the deposition of $Zn_2In_2O_5$ was again started, and power applied to the target 1206 was decreased at a rate of 1 W per second to carry out discharging for 3 minutes. In this way, a transparent electrode layer whose composition was continuously changed in the layer thickness direction was deposited in a thickness of about 1,500 angstroms. At the outermost surface, the composition of the transparent electrode layer was $Zn_{0.90}In_{0.10}O_{1.04}$. The subsequent procedure for the preparation of Sample 16 was repeated up to the formation of the protective layer, to obtain Sample 18.

Thereafter, characteristics of these samples were measured under irradiation by light of AM 1.5 (100 mW/cm$^2$) to make evaluation. Results obtained are shown in Table 5 below.

TABLE 5

| Sample | Composition of transparent electrode | Jsc | Conversion efficiency |
|---|---|---|---|
| 16 | $Zn_2In_2O_5/In_2O_3$ | 100 | 100 |
| 17 | $Zn_2In_2O_5 \rightarrow Zn_{0.09}In_{0.91}O_{1.42}$ | 102 | 103 |
| 18 | $Zn_2In_2O_5 \rightarrow Zn_{0.09}In_{0.10}O_{1.04}$ | 103 | 102 |

Although the mechanism is unclear, the Jsc can be further improved when the transparent electrode layer is so made as to have a high refractive index on the substrate side and a low refractive index on the protective layer side and have the refractive index continuously changed between them, compared with the double-layer transparent electrode layer designed according to the expressions (3), (4) and (4'). As a matter of fact, the reason why such continuous compositional changes can bring about an improvement is that the $Zn_\alpha In_\beta O_\gamma$ ($0<\alpha,\beta,\gamma$) can provide a transparent and conductive film whatever proportion the $\alpha$ and $\beta$ stand, and also that the refractive index is continuously changed from the highest refractive index possessed by $Zn_2In_2O_5$. Incidentally, in Samples 17 and 18, the outermost surfaces are not composed of $In_2O_3$ or ZnO. This is because it becomes impossible to maintain the discharging when the discharge power is lowered to a certain degree in the sputtering apparatus. More improvement can be expected if the outermost surfaces are made to be composed of $In_2O_3$ or ZnO.

As described above, according to the present invention, the employment of the novel transparent electrode material can make optically optimum the prevention of reflection at the first-layer film or second-layer film even when the protective layer is provided on the surface. The novel transparent electrode material used in the present invention can be compositionally controlled to continuously change the refractive index, and the reflection can be more preferably prevented by utilizing such a feature, so that photovoltaic devices more improved in conversion efficiency can be obtained. Also, the novel transparent electrode in the present invention has no factors of cost increase in respect of materials therefor and its deposition process, promising a high mass productivity, and contributes to real spread of photovoltaic devices.

Needless to say, the present invention is by no means limited to the foregoing description, and can be appropriately modified and combined within the purport of the present invention.

What is claimed is:

1. A photovoltaic device comprising a back-surface electrode layer, a photovoltaic layer, a transparent electrode layer provided on the photovoltaic layer in close contact, and a transparent protective layer further provided thereon; wherein the transparent electrode layer comprises $Zn_\alpha In_\beta O_\gamma$ where $0<\alpha,\beta,\gamma$, and has a thickness which is $\frac{1}{4}n$ of the wavelength of light to which the photovoltaic device has a maximum sensitivity, where n is a refractive index of the transparent electrode layer at that wavelength.

2. The photovoltaic device according to claim 1, wherein, in the composition of the transparent electrode layer, a=2, $\beta$=2 and $\gamma$=5.

3. The photovoltaic device according to claim 1, wherein with respect to the light having a wavelength of at which the photovoltaic device has a maximum sensitivity, at least the photovoltaic layer has a refractive index of 3.2 or above and the protective layer has a refractive index of 1.3 or above.

4. The photovoltaic device according to claim 1, wherein the photovoltaic layer has a p-type semiconductor layer, an n-type semiconductor layer, and an i-type semiconductor layer provided between the p-type and n-type semiconductor layers.

5. The photovoltaic device according to claim 4, wherein the photovoltaic layer has the p-type, i-type and n-type semiconductor layers in a plurality of sets.

6. The photovoltaic device according to claim 1, wherein the photovoltaic layer has a pn junction.

7. A photovoltaic device comprising a back-surface electrode layer, a photovoltaic layer, at least two transparent electrode layers provided on the photovoltaic layer in close contact, and a transparent protective layer further provided thereon; wherein the transparent electrode layer on the photovoltaic layer side comprises $Zn_\alpha In_\beta O_\gamma$ where $0<\alpha,\beta,\gamma$, and the transparent electrode layer on the transparent protective layer side has a refractive index made lower than the transparent electrode layer on the photovoltaic layer side, with respect to at least light having a wavelength at which the photovoltaic device has a maximum sensitivity.

8. The photovoltaic device according to claim 7, wherein, in the composition of the transparent electrode layer on the photovoltaic layer side, $\alpha=2$, $\beta=2$ and $\gamma=5$.

9. The photovoltaic device according to claim 7, wherein the transparent protective layer has a refractive index of 1.3 or above with respect to the light having a wavelength at which the photovoltaic device has a maximum sensitivity.

10. The photovoltaic device according to claim 9, wherein the photovoltaic layer has a refractive index of 3.2 or above with respect to the light having the wavelength.

11. The photovoltaic device according to claim 7, wherein the photovoltaic layer has a p-type semiconductor layer, an n-type semiconductor layer, and an i-type semiconductor layer provided between the p-type and n-type semiconductor layers.

12. The photovoltaic device according to claim 11, wherein the photovoltaic layer has the p-type, i-type and n-type semiconductor layers in a plurality of sets.

13. The photovoltaic device according to claim 7, wherein the photovoltaic layer has a pn junction.

14. A photovoltaic device comprising a back-surface electrode layer, a photovoltaic layer, a transparent electrode layer provided on the photovoltaic layer in close contact, and a transparent protective layer further provided thereon; wherein the transparent electrode layer comprises $Zn_\alpha In_\beta O_\gamma$ where $0<\alpha,\beta,\gamma$, and a value of $\alpha/(\alpha+\beta)$ becomes monotonously greater in that layer from the protective layer side toward the photovoltaic layer side but a maximum value thereof does not exceed 0.5.

15. The photovoltaic device according to claim 14, wherein the transparent protective layer has a refractive index of 1.3 or above with respect to the light having a wavelength at which the photovoltaic device has a maximum sensitivity.

16. The photovoltaic device according to claim 15, wherein the photovoltaic layer has a refractive index of 3.2 or above with respect to the light having the wavelength.

17. The photovoltaic device according to claim 14, wherein the photovoltaic layer has a p-type semiconductor layer, an n-type semiconductor layer, and an i-type semiconductor layer provided between the p-type and n-type semiconductor layers.

18. The photovoltaic device according to claim 17, wherein the photovoltaic layer has the p-type, i-type and n-type semiconductor layers in a plurality of sets.

19. The photovoltaic device according to claim 14, wherein the photovoltaic layer has a pn junction.

20. A photovoltaic device comprising a back-surface electrode layer, a photovoltaic layer, a transparent electrode layer provided on the photovoltaic layer in close contact, and a transparent protective layer further provided thereon; wherein the transparent electrode layer comprises $Zn_\alpha In_\beta O_\gamma$ where $0<\alpha,\beta,\gamma$, and a value of $\beta/(\alpha+\beta)$ becomes monotonously greater in that layer from the protective layer side toward the photovoltaic layer side but a maximum value thereof does not exceed 0.5.

21. The photovoltaic device according to claim 20, wherein the transparent protective layer has a refractive index of 1.3 or above with respect to the light having a wavelength at which the photovoltaic device has a maximum sensitivity.

22. The photovoltaic device according to claim 21, wherein the photovoltaic layer has a refractive index of 3.2 or above with respect to the light having the wavelength.

23. The photovoltaic device according to claim 20, wherein the photovoltaic layer has a p-type semiconductor layer, an n-type semiconductor layer, and an i-type semiconductor layer provided between the p-type and n-type semiconductor layers.

24. The photovoltaic device according to claim 20, wherein the photovoltaic layer has a pn junction.

25. The photovoltaic device according to claim 23, wherein the photovoltaic layer has the p-type, i-type and n-type semiconductor layers in a plurality of sets.

26. A photovoltaic device comprising a transparent substrate, a transparent electrode layer provided thereon in close contact, a photovoltaic layer further provided thereon in close contact, and a back-surface electrode layer; wherein the transparent electrode layer comprises $Zn_\alpha In_\beta O_\gamma$ where $0<\alpha,\beta,\gamma$, and has a thickness which is ¼n of the wavelength of light to which the photovoltaic device has a maximum sensitivity, where n is a refractive index of the transparent electrode layer at that wavelength.

27. The photovoltaic device according to claim 26, wherein, in the composition of the transparent electrode layer, $\alpha=2$, $\beta=2$ and $\gamma=5$.

28. The photovoltaic device according to claim 26, wherein with respect to the light having a wavelength of at which the photovoltaic device has a maximum sensitivity, at least the photovoltaic layer has a refractive index of 3.2 or above and the transparent substrate has a refractive index of 1.3 or above.

29. The photovoltaic device according to claim 26, wherein the photovoltaic layer has a p-type semiconductor layer, an n-type semiconductor layer, and an i-type semiconductor layer provided between the p-type and n-type semiconductor layers.

30. The photovoltaic device according to claim 29, wherein the photovoltaic layer has the p-type, i-type and n-type semiconductor layers in a plurality of sets.

31. The photovoltaic device according to claim 26, wherein the photovoltaic layer has a pn junction.

32. A photovoltaic device comprising a transparent substrate, at least two transparent electrode layers provided thereon in close contact, a photovoltaic layer further provided thereon in close contact, and a back-surface electrode layer; wherein the transparent electrode layer on the photovoltaic layer side comprises $Zn_\alpha In_\beta O_\gamma$ where $0<\alpha,\beta,\gamma$, and the transparent electrode layer on the transparent substrate side has a refractive index made lower than the transparent electrode layer on the photovoltaic layer side, with respect to at least light having a wavelength at which the photovoltaic device has a maximum sensitivity.

33. The photovoltaic device according to claim 32, wherein, in the composition of the transparent electrode layer on the photovoltaic layer side, $\alpha=2$, $\beta=2$ and $\gamma=5$.

34. The photovoltaic device according to claim 32, wherein the transparent protective layer has a refractive index of 1.3 or above with respect to the light having a wavelength at which the photovoltaic device has a maximum sensitivity.

35. The photovoltaic device according to claim 34, wherein the photovoltaic layer has a refractive index of 3.2 or above with respect to the light having the wavelength.

36. The photovoltaic device according to claim 32, wherein the photovoltaic layer has a p-type semiconductor layer, an n-type semiconductor layer, and an i-type semiconductor layer provided between the p-type and n-type semiconductor layers.

37. The photovoltaic device according to claim 36, wherein the photovoltaic layer has the p-type, i-type and n-type semiconductor layers in a plurality of sets.

38. The photovoltaic device according to claim 32, wherein the photovoltaic layer has a pn junction.

39. A photovoltaic device comprising a transparent substrate, a transparent electrode layer provided thereon in close contact, a photovoltaic layer further provided thereon in close contact, and a back-surface electrode layer; wherein the transparent electrode layer comprises $Zn_\alpha In_\beta O_\gamma$ where $0<\alpha,\beta,\gamma$, and a value of $\alpha/(\alpha+\beta)$ becomes monotonously greater in that layer from the transparent substrate side toward the photovoltaic layer side but a maximum value thereof does not exceed 0.5.

40. The photovoltaic device according to claim 39, wherein the transparent protective layer has a refractive index of 1.3 or above with respect to the light having a wavelength at which the photovoltaic device has a maximum sensitivity.

41. The photovoltaic device according to claim 40, wherein the photovoltaic layer has a refractive index of 3.2 or above with respect to the light having the wavelength.

42. The photovoltaic device according to claim 39, wherein the photovoltaic layer has a p-type semiconductor layer, an n-type semiconductor layer, and an i-type semiconductor layer provided between the p-type and n-type semiconductor layers.

43. The photovoltaic device according to claim 42, wherein the photovoltaic layer has the p-type, i-type and n-type semiconductor layers in a plurality of sets.

44. The photovoltaic device according to claim 39, wherein the photovoltaic layer has a pn junction.

45. A photovoltaic device comprising a transparent substrate, a transparent electrode layer provided thereon in close contact, a photovoltaic layer further provided thereon in close contact, and a back-surface electrode layer; wherein the transparent electrode layer comprises $Zn_\alpha In_\beta O_\gamma$ where $0<\alpha,\beta,\gamma$, and a value of $\beta/(\alpha+\beta)$ becomes monotonously greater in that layer from the transparent substrate side toward the photovoltaic layer side but a maximum value thereof does not exceed 0.5.

46. The photovoltaic device according to claim 45, wherein the transparent protective layer has a refractive index of 1.3 or above with respect to the light having a wavelength at which the photovoltaic device has a maximum sensitivity.

47. The photovoltaic device according to claim 46, wherein the photovoltaic layer has a refractive index of 3.2 or above with respect to the light having the wavelength.

48. The photovoltaic device according to claim 45, wherein the photovoltaic layer has a p-type semiconductor layer, an n-type semiconductor layer, and an i-type semiconductor layer provided between the p-type and n-type semiconductor layers.

49. The photovoltaic device according to claim 48, wherein the photovoltaic layer has the p-type, i-type and n-type semiconductor layers in a plurality of sets.

50. The photovoltaic device according to claim 45, wherein the photovoltaic layer has a pn junction.

51. A photovoltaic device comprising a photovoltaic layer and a protective layer provided thereon, interposing a transparent conductive layer between them; wherein the transparent conductive layer comprises $Zn_\alpha In_\beta O_\gamma$ where $0<\alpha,\beta,\gamma$.

52. The photovoltaic device according to claim 51, wherein the transparent conductive layer is provided in plurality and comprises the $Zn_\alpha In_\beta O_\gamma$ on the photovoltaic layer side.

53. The photovoltaic device according to claim 52, wherein the transparent conductive layer on the photovoltaic layer side has a refractive index greater than that of the transparent conductive layer distant from the photovoltaic layer.

54. The photovoltaic device according to claim 51, wherein the transparent conductive layer comprises $Zn_\alpha In_\beta O_\gamma$ compositionally changed in the layer thickness direction.

55. The photovoltaic device according to claim 54, wherein the transparent conductive layer has a refractive index made smaller as it becomes distant from the photovoltaic layer.

56. The photovoltaic device according to claim 55, wherein the transparent conductive layer has a value of $\beta/(\alpha+\beta)$ which becomes monotonously greater in that layer toward the photovoltaic layer side but a maximum value thereof does not exceed 0.5.

57. The photovoltaic device according to claim 55, wherein the transparent conductive layer has a value of $\alpha/(\alpha+\beta)$ becomes monotonously greater in that layer toward the photovoltaic layer side but a maximum value thereof does not exceed 0.5.

58. The photovoltaic device according to claim 51, wherein the photovoltaic layer has a p-type semiconductor layer, an n-type semiconductor layer, and an i-type semiconductor layer provided between the p-type and n-type semiconductor layers.

59. The photovoltaic device according to claim 55, wherein the photovoltaic layer has the p-type, i-type and n-type semiconductor layers in a plurality of sets.

60. The photovoltaic device according to claim 51, wherein the photovoltaic layer has a pn junction.

61. The photovoltaic device according to claim 51, wherein the protective layer comprises a resin.

62. The photovoltaic device according to claim 51, wherein the protective layer comprises a glass.

63. The photovoltaic device according to claim 51, wherein the photovoltaic layer has a refractive index of 3.2 or above.

64. The photovoltaic device according to claim 51, wherein the protective layer has a refractive index of 1.3 or above.

65. The photovoltaic device according to claim 51, wherein the transparent conductive layer has a thickness which is ¼n of the wavelength of light to which the photovoltaic device has a maximum sensitivity, where n is a refractive index of the transparent conductive layer at that wavelength.

66. The photovoltaic device according to claim 51, wherein a collector electrode is provided in contact with the transparent conductive layer.

* * * * *

UNITED STATES PATENT AND TRADEMARK OFFICE
CERTIFICATE OF CORRECTION

PATENT NO. : 5,858,120

DATED : January 12, 1999

INVENTOR(S) : KATSUMI NAKAGAWA ET AL.

It is certified that error appears in the above-identified patent and that said Letters Patent is hereby corrected as shown below:

On the title page, item:

[56] REFERENCES CITED

```
   Foreign Patent Documents
   "3030419  2/1991 Japan" should read --3-30419 2/1991
       Japan--.

COLUMN 1

Line 12, "can not" should read --cannot--.

COLUMN 2

Line 17, "Further" should read --Further,--.
   Line 61, "these can not well serve" should read
       --these cannot serve well--.

COLUMN 3

Line 2, "difficulty, bring about a disadvantage."
       should read --difficulty.--.
   Line 5, "manners" should read --ways--.
   Line 49, "well" should read --very--.

COLUMN 5

Line 45, "subject can be settled" should read
       --object can be achieved--.
```

UNITED STATES PATENT AND TRADEMARK OFFICE
CERTIFICATE OF CORRECTION

PATENT NO. : 5,858,120

DATED : January 12, 1999

INVENTOR(S) : KATSUMI NAKAGAWA ET AL.

It is certified that error appears in the above-identified patent and that said Letters Patent is hereby corrected as shown below:

COLUMN 6

```
Line 20, "the" (second occurrence) should be deleted.
Line 35, "invention" should read --invention may--.
Line 47, "invention" should read --invention may--.
Line 58, "invention" should read --invention may--.
```

COLUMN 7

```
Line 62, "An" should read --A--.
```

COLUMN 9

```
Line 20, "state" should read --state where--.
Line 58, "may" should be deleted.
Line 59, "has" should read --has a--.
Line 60, "such" should read --such a--.
Line 63, "such" should read --such a--.
```

COLUMN 10

```
Line 2, "in" should read --with--.
Line 41, "working" should read --practicing--.
Line 60, "substrates of metals having a conductivity"
    should read --conductive metal substrates--.
Line 61, "in themselves" should be deleted.
```

UNITED STATES PATENT AND TRADEMARK OFFICE
CERTIFICATE OF CORRECTION

PATENT NO. : 5,858,120

DATED : January 12, 1999

INVENTOR(S) : KATSUMI NAKAGAWA ET AL.

It is certified that error appears in the above-identified patent and that said Letters Patent is hereby corrected as shown below:

COLUMN 11

Line 23, "currents from flowing." should read
      --of currents.--.
    Line 29, "in respect of" should read --with respect to--.
    Line 32, "in respect of" should read --with respect to--.
    Line 39, "series" should read --series of--.

COLUMN 12

Line 67, "such" should read --such a--.

COLUMN 13

Line 7, "in respect" should read --with respect--.
    Line 8, "of" (first occurrence) should read --to--.
    Line 36, "cross section" should read --cross-section--.

COLUMN 14

Line 67, "PH3/H2" should read --$PH_3/H_2$--.

UNITED STATES PATENT AND TRADEMARK OFFICE
CERTIFICATE OF CORRECTION

PATENT NO.  : 5,858,120

DATED       : January 12, 1999

INVENTOR(S) : KATSUMI NAKAGAWA ET AL.

It is certified that error appears in the above-identified patent and that said Letters Patent is hereby corrected as shown below:

COLUMN 15

Line 1, "H2)" should read --$H_2$)--; and "H2" should read --$H_2$--.
Line 10, "H2" should read --$H_2$--.
Line 18, "BF3/H2" should read --$BF_3/H_2$--.
Line 19, "H2)" should read --$H_2$)--; and "H2" should read --$H_2$--.
Line 29, "layer of" should read --layers,--.
Line 30, "layer 808 of" should read --layer 808,--.
Line 49, "show" should read --shows--.

COLUMN 16

Line 20, "firstly" should read --first--.
Line 21, "secondly" should read --second--.
Line 45, "layer of" should read --layer,--.
Line 50, "layer of" should read --layer,--.
Line 54, "(100 mW/cm$^2$) to make" should read --(100 mW/cm$^2$).--.
Line 55, "evaluation." should be deleted.

COLUMN 17

Line 21, "firstly" should read --first--.
Line 37, "fast rotated" should read --rotated quickly--.

UNITED STATES PATENT AND TRADEMARK OFFICE
CERTIFICATE OF CORRECTION

PATENT NO. : 5,858,120

DATED : January 12, 1999

INVENTOR(S) : KATSUMI NAKAGAWA ET AL.

It is certified that error appears in the above-identified patent and that said Letters Patent is hereby corrected as shown below:

COLUMN 18

Line 63, "a=2," should read --$\alpha$=2,--.

COLUMN 22

Line 42, "claim 55," should read --claim 58,--.

Signed and Sealed this

Seventh Day of September, 1999

Attest:

Q. TODD DICKINSON

Attesting Officer

Acting Commissioner of Patents and Trademarks